(12) United States Patent
Wang et al.

(10) Patent No.: US 11,331,899 B2
(45) Date of Patent: May 17, 2022

(54) MANUFACTURING METHOD AND MANUFACTURING DEVICE OF FLEXIBLE DISPLAY PANEL

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Wei Wang, Beijing (CN); Zhifeng Zhan, Beijing (CN); Yanxin Wang, Beijing (CN); Shuquan Yang, Beijing (CN); Jiafan Shi, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/632,734

(22) PCT Filed: Jul. 9, 2019

(86) PCT No.: PCT/CN2019/095185
§ 371 (c)(1),
(2) Date: Jan. 21, 2020

(87) PCT Pub. No.: WO2020/019974
PCT Pub. Date: Jan. 30, 2020

(65) Prior Publication Data
US 2021/0138782 A1    May 13, 2021

(30) Foreign Application Priority Data
Jul. 23, 2018    (CN) .......................... 201810812395.3

(51) Int. Cl.
*B32B 43/00*      (2006.01)
*H01L 51/00*     (2006.01)
(Continued)

(52) U.S. Cl.
CPC .......... *B32B 43/006* (2013.01); *B32B 43/003* (2013.01); *B32B 38/10* (2013.01);
(Continued)

(58) Field of Classification Search
CPC . B32B 38/10; B32B 43/006; Y10T 156/1168; Y10T 156/1967; Y10T 156/1978
See application file for complete search history.

(56) References Cited

U.S. PATENT DOCUMENTS

| | | | |
|---|---|---|---|
| 6,408,132 B1 * | 6/2002 | Ishikawa | G03D 15/001 396/2 |
| 8,905,807 B2 * | 12/2014 | Kim | C03B 33/076 445/25 |
| 10,553,831 B2 * | 2/2020 | Kim | H01L 33/505 |
| 2002/0088320 A1 * | 7/2002 | Marbach | B26D 7/1863 83/23 |

(Continued)

OTHER PUBLICATIONS

First Indian Office Action from Indian Patent Application No. 202017047459 dated Jun. 25, 2021.
(Continued)

*Primary Examiner* — Philip C Tucker
*Assistant Examiner* — Nickolas R Harm
(74) *Attorney, Agent, or Firm* — Dilworth & Barrese, LLP.; Michael J. Musella, Esq.

(57) ABSTRACT

A manufacturing method and a manufacturing device of a flexible panel are provided. the flexible panel includes a bending area, and the manufacturing method includes: providing a panel unit including a flexible substrate and a back film which are laminated, the panel unit including a panel area corresponding to the flexible panel and a non-panel area outside the panel area; and removing the non-panel area of the panel unit while peeling off a peelable portion of the back film in the bending area of the flexible panel.

17 Claims, 10 Drawing Sheets

(51) Int. Cl.
    *H01L 51/56*     (2006.01)
    *B32B 38/10*     (2006.01)

(52) U.S. Cl.
    CPC .......... *H01L 51/0097* (2013.01); *H01L 51/56* (2013.01); *Y10T 156/1168* (2015.01); *Y10T 156/1967* (2015.01); *Y10T 156/1978* (2015.01)

(56) References Cited

U.S. PATENT DOCUMENTS

| | | | |
|---|---|---|---|
| 2006/0040081 A1* | 2/2006 | Hodsdon | G09F 3/10 428/40.1 |
| 2008/0149271 A1* | 6/2008 | Qi | B29C 63/0013 156/718 |
| 2012/0216961 A1* | 8/2012 | Tsai | H01L 21/67092 156/707 |
| 2013/0011628 A1* | 1/2013 | Hamalainen | B32B 3/02 428/189 |
| 2014/0183473 A1 | 7/2014 | Lee et al. | |
| 2015/0029143 A1 | 1/2015 | Kang et al. | |
| 2015/0060933 A1 | 3/2015 | Ohno et al. | |
| 2015/0319893 A1* | 11/2015 | Ohno | B32B 43/006 156/702 |
| 2018/0102509 A1 | 4/2018 | Kim | |

OTHER PUBLICATIONS

Extended European Search Report from European Patent Application No. 19835344.3 dated Mar. 18, 2022.

\* cited by examiner

S61 — placing the panel unit at the first processing table with the second surface of the flexible substrate facing away from the processing table, performing a first cutting process on the flexible substrate to divide the flexible substrate into the first and second substrate portions, and meanwhile performing the second cutting process on the back film along a cutting path of the first cutting process, except for a periphery of the second sub-portion S62 — turning over and placing the panel unit at the second processing table with the first surface of the flexible substrate facing away from the second processing table, and performing the second cutting process on the back film along the periphery of the second sub-portion, so as to divide the back film into the first and second back film portions

FIG. 6

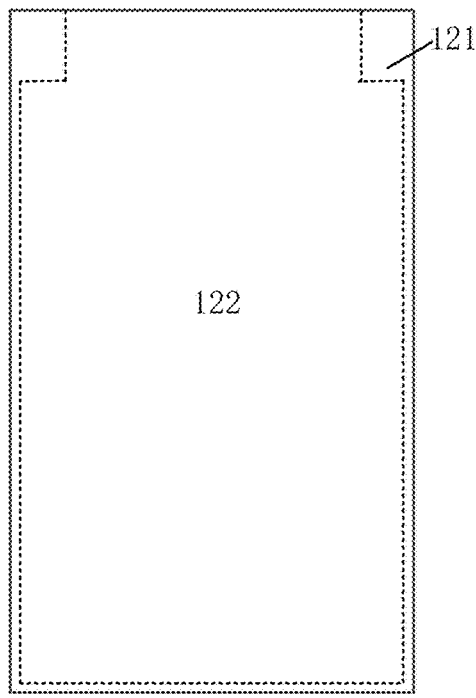

MANUFACTURING METHOD AND MANUFACTURING DEVICE OF FLEXIBLE DISPLAY PANEL

The present application claims priority of Chinese Patent Application No. 201810812395.3, filed on Jul. 23, 2018, the disclosure of which is incorporated herein by reference in its entirety as part of the present application.

TECHNICAL FIELD

Embodiments of the present disclosure relate to a manufacturing method and a manufacturing device of a flexible display panel.

BACKGROUND

With a development of flexible electronic technologies, a flexible electronic device with a foldable property is preferred gradually. For example, in order to implement narrow bezel or even bezel-free display of a display device, a non-display area of the display device may be bent; or for portability, the electronic device may also be curved. A performance of the flexible electronic device is closely related to a manufacturing technology, and how to improve the flexible electronic technologies is a concern in the field.

SUMMARY

Embodiments of the present disclosure provide a manufacturing method of a flexible panel, the flexible panel comprising a bending area, the manufacturing method comprising: providing a panel unit, wherein the panel unit comprises a flexible substrate and a back film which are laminated, and the panel unit comprises a panel area corresponding to the flexible panel and a non-panel area outside the panel area; and removing the non-panel area of the panel unit while peeling off a peelable portion of the back film in the bending area of the flexible panel.

For example, the removing the non-panel area of the panel unit while peeling off the peelable portion of the back film in the bending area of the flexible panel comprises: cutting the flexible substrate, to divide the flexible substrate into a first substrate portion corresponding to the non-panel area and a second substrate portion corresponding to the panel area; and cutting the back film, to divide the back film into a first back film portion and a second back film portion, the first back film portion comprising a first sub-portion and a second sub-portion which are connected with each other, the first sub-portion corresponding to the non-panel area, and the second sub-portion being configured as the peelable portion of the back film corresponding to the bending area.

For example, the flexible substrate comprises a first surface and a second surface which are opposite to each other, and the back film is on the first surface of the flexible substrate; the cutting the back film, to divide the back film into the first back film portion and the second back film portion, comprises: placing the panel unit on a first processing table with the second surface of the flexible substrate facing away from the first processing table, and performing a first cutting process on the flexible substrate to divide the flexible substrate into the first substrate portion and the second substrate portion.

For example, the cutting the back film into the first back film portion and the second back film portion comprises: turning over and placing the panel unit on a second processing table with the first surface of the flexible substrate facing away from the second processing table, and performing a second cutting process on the back film to divide the back film into the first back film portion and second back film portion.

For example, the cutting the back film into the first back film portion and second back film portion comprises: cutting the back film along a cutting path of the first cutting process except for a periphery of the second sub-portion while performing the first cutting process on the flexible substrate.

For example, the cutting the back film into the first back film portion and the second back film portion further comprises: turning over and placing the panel unit at the second processing table with the first surface of the flexible substrate facing away from the second processing table, and performing the second cutting process on the back film along the periphery of the second sub-portion to divide the back film into the first back film portion and the second back film portion.

For example, the non-panel area of the panel unit is removed in a case where the first surface of the flexible substrate faces away from the second processing table.

For example, the removing the non-panel area of the panel unit comprises: separating the first substrate portion from the second processing table, and peeling off the second sub-portion of the back film from the flexible substrate with the first substrate portion as a point of action.

For example, the separating the first substrate portion from the second processing table comprises: picking up the first substrate portion from the second processing table to separate the first substrate portion from the second processing table.

For example, the picking up the first substrate portion from the second processing table comprises: inserting a blade between the first substrate portion and the second processing table, and lifting the first substrate portion.

For example, the picking up the first substrate portion from the second processing table comprises: enabling a supporting rod provided in the second processing table to protrude from the second processing table, so as to lift the first substrate portion.

For example, the separating the first substrate portion from the second processing table further comprises: clamping the first substrate portion by a clamp and driving the first substrate portion to peel off the second sub-portion of the back film.

For example, in a case where the panel unit is placed at the first processing table, the panel unit is fixed to the first processing table through vacuum absorption.

For example, the removing the portion of the panel unit corresponding to the non-panel area comprises cutting by a cutting wheel or a cutting laser.

Embodiments of the present disclosure further provide a manufacturing device of a flexible panel, which is configured to implement the above manufacturing method of a flexible panel. The manufacturing device comprises a back film removing unit which is configured to remove the non-panel area of the panel unit while peeling off the peelable portion of the back film located in the bending area of the flexible panel.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

FIG. 6 is a flow chart of a cutting method of a flexible panel provided by another embodiment of the present disclosure;

FIGS. 7A to 7C show cutting paths of a cutting method of a flexible panel provided by another embodiment of the present disclosure;

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "comprise," "including," etc., are intended to specify that the elements or the objects stated before these terms encompass the elements or the objects and equivalents thereof listed after these terms, but do not preclude the other elements or objects. The phrases "connect", "coupled", etc., are not intended to define a physical connection or mechanical connection, but may comprise an electrical connection, directly or indirectly. "On," "under," and the like are only used to indicate relative position relationship, and when the absolute position of the object which is described is changed, the relative position relationship may be changed accordingly.

Figure 1A:
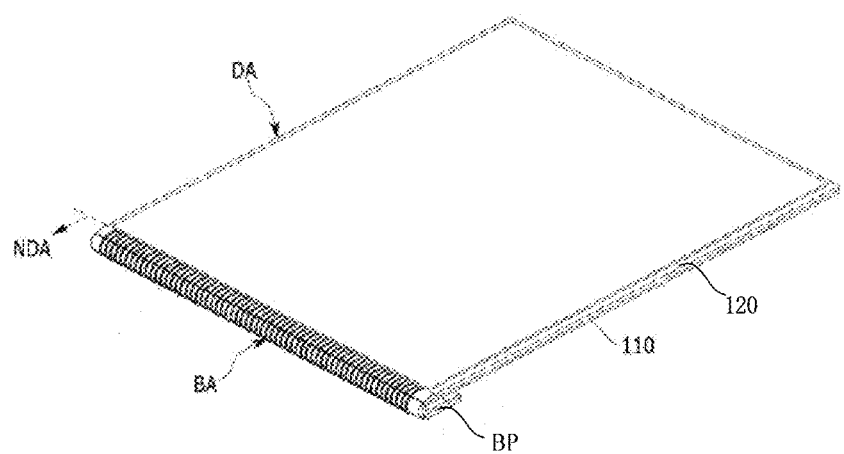
FIG. 1A is a perspective view of a flexible panel.
Figure 1B:
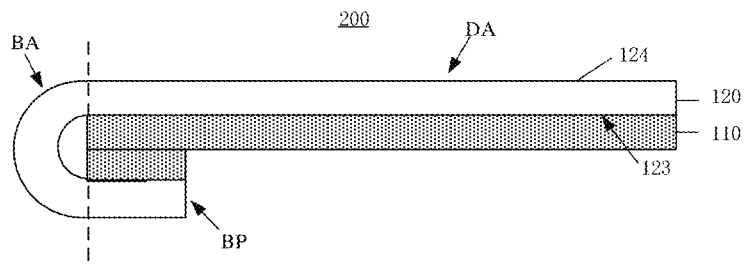
FIG. 1B is a sectional view of the flexible panel.

As shown in FIG. 1A, in order to achieve a narrow-bezel display effect of a display panel, at least a part of a non-display area (NDA), for example, a bonding pad (BP) area, of the display panel may be bent to a back side (i.e., a side opposite to a display side) of the display panel, and thus, a bending area (BA) is formed between a display area DA and the bonding pad BP area of the display panel, connects the display area with the bonding pad area, and is located at a different plane from the display area. In this case, a back film 110 provided at a back surface of a flexible substrate 120 is required to be bent at a great curvature at the bending area BA; that is, the bending area is configured as a curved surface, which not only limits a thickness of the back film, but also requires a high bending resistance of the back film. Therefore, usually, a portion of the back film located at the bending area is removed to form a structure of a flexible panel as shown in FIG. 1B, so as to reduce an influence of a bending stress on the back film, while facilitating better attachment between a portion of the back film located at the bonding pad area and the back surface of the display panel. Due to the narrow portion of the back film located at the bending area, high alignment precision is required in a removal process. Currently, a method of removing this portion of the back film includes: patterning the back film and then attaching the back film to the flexible substrate, or attaching the back film to the flexible substrate and then burning this portion of the back film using laser with high energy for removal. However, the former method has limited attachment precision, and in the latter method, the energy of the laser is high and prone to damage a device structure in the display panel corresponding to this portion of the back film.

During a manufacturing process of the display panel, in order to increase a production efficiency and reduce a production cost, usually, a plurality of panel units are formed at one substrate simultaneously, and then cut into a plurality of independent panel units. Each panel unit includes a panel area corresponding to the display panel and a non-panel area other than the panel area, and a second cutting process to remove the non-panel area of the panel unit is required to form the display panel finally. For example, the non-panel area includes a detection area of the display panel, and for example, a detection circuit (for example, a contact pad) and a device (for example, an electrostatic ring, or the like) are formed at the detection area, for detecting the display panel before formation thereof.

An embodiment of the present disclosure provides a manufacturing method of a flexible panel, including: providing a panel unit; and removing a non-panel area of the panel unit while peeling off a peelable portion of a back film located in a bending area of the flexible panel.

In the manufacturing method of a flexible panel according to the embodiment of the present disclosure, because the peelable portion of the back film located in the bending area is adjacent and connected to a portion of the back film located in the non-panel area of the panel unit, the peelable portion of the back film is taken away while the panel unit is processed to remove the non-panel area thereof, which overcomes the difficulty in accurately peeling the peelable portion due to its narrow and small shape while dispensing with an extra processing step of peeling the back film, saving a process cost, and increasing an efficiency and a yield.

Figure 2A:
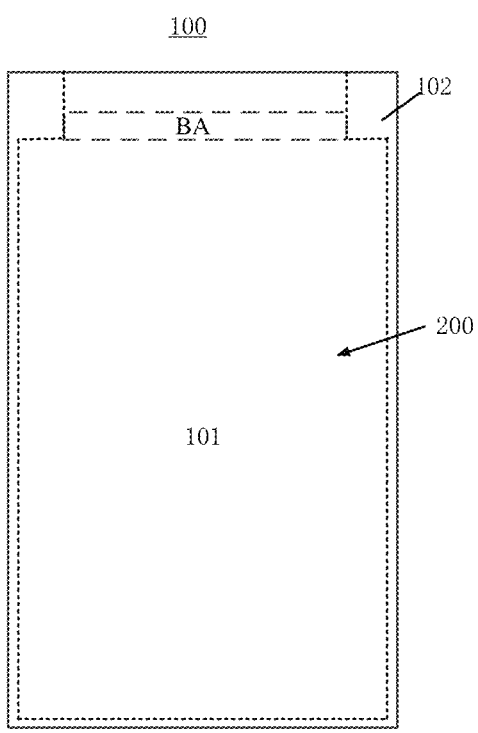
FIGS. 2A to 2B are schematic structural planar diagrams of the flexible panel.

FIG. 2A is a schematic structural planar diagram of a panel unit configured to form a flexible panel according to one embodiment of the present disclosure. For example, the panel unit is configured to form the flexible panel 200 as shown in FIG. 1B. As shown in FIG. 2A, the panel unit 100 includes a panel area 101 in a dotted box and a non-panel area 102 located outside the dotted box, wherein the panel area 101 corresponds to the flexible panel 200 to be formed. That is, the panel area 101 is configured as an area where the flexible panel 200 is located.

Referring to FIG. 1B, the panel unit 100 includes a flexible substrate 120 and a back film 110 which are laminated, the flexible substrate 120 includes a first surface 123 and a second surface 124 which are opposite to each other, and the back film 110 is provided at the first surface 123. The second surface 124 serves as a display side surface, and correspondingly, the first surface 123 serves as a back side surface. For example, the flexible substrate 120 includes a flexible base substrate and a display structure (not shown) provided at the flexible base substrate, and the display structure includes a pixel array structure configured to realize a display function. For example, the display panel is configured as an organic light emitting diode (OLED) display panel, and the pixel array structure includes a plurality of gate lines, a plurality of data lines and a plurality of pixel units driven by the gate lines and the data lines. Each pixel unit includes an organic light emitting diode and a pixel circuit which drives the organic light emitting diode to emit light. For example, the pixel circuit is configured as various types of pixel circuits, including a conventional 2T1C or 3T1C circuit, a pixel circuit based thereon and having a compensation function, or the like, which are not repeated herein.

For example, the base substrate is made of an organic flexible material, for example, polyimide (PI), polyethylene terephthalate (PET), polycarbonate, polyethylene, polyacrylate, polyetherimide, polyethersulfone, or the like.

For example, the back film 110 is made of an organic flexible material, for example, polyimide, polyethylene terephthalate, polycarbonate, a cycloolefin polymer, polyacrylate, or the like.

For example, the flexible substrate 120 may further include a touch structure configured to realize a touch function, or the like (not shown). For example, the touch structure is configured as a mutual capacitance type touch panel or a self-capacitance type touch structure. For example, the touch structure is configured as an out-cell structure laminated on the display structure or an embedded structure integrated into the display panel, which is not repeated herein.

Figure 2B:
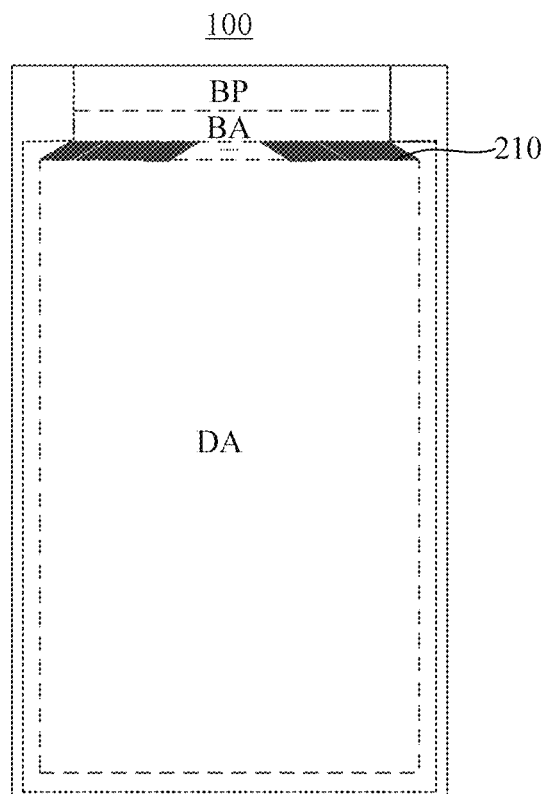

FIG. 2B shows a specific layout in the panel area. For example, as shown in FIG. 2B, in the panel area 101, the flexible panel 200 further includes a display area DA and a bonding pad BP area. The pixel array structure of the display panel is provided in the display area DA; the bonding pad BP area is located outside the display area DA and provided therein with a bonding pad (not shown) configured to be bonded to an external element (for example, a drive chip), so as to provide various signals, for example, a power voltage signal, a timing signal, or the like, for the pixel array structure of the display area. The pixel array structure in the display area DA is connected with the bonding pad by a fan-out line 210, so as to implement signal transmission between the pixel array structure and the bonding pad, and a portion of the fan-out line located in a fan-out area is shown. A bending area BA is located between the display area DA and the bonding pad area BP, and the bonding pad area BP may be folded to the back surface of the flexible panel 200 by bending the bending area BA, thereby realizing narrow bezel display. For example, the bending area BA is located between the fan-out area and the bonding pad BP area to separate them.

Figure 3A:
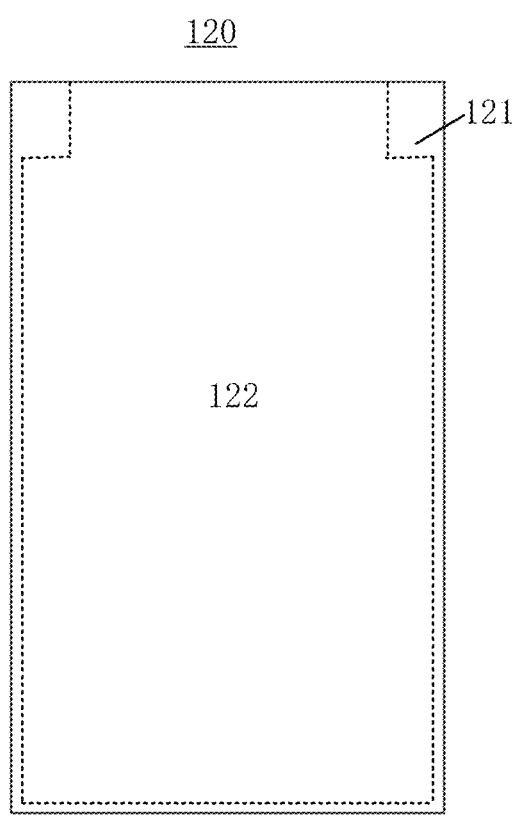
FIGS. 3A and 3B are schematic planar diagrams of a flexible substrate and a back film in the flexible panel respectively.
Figure 3B:
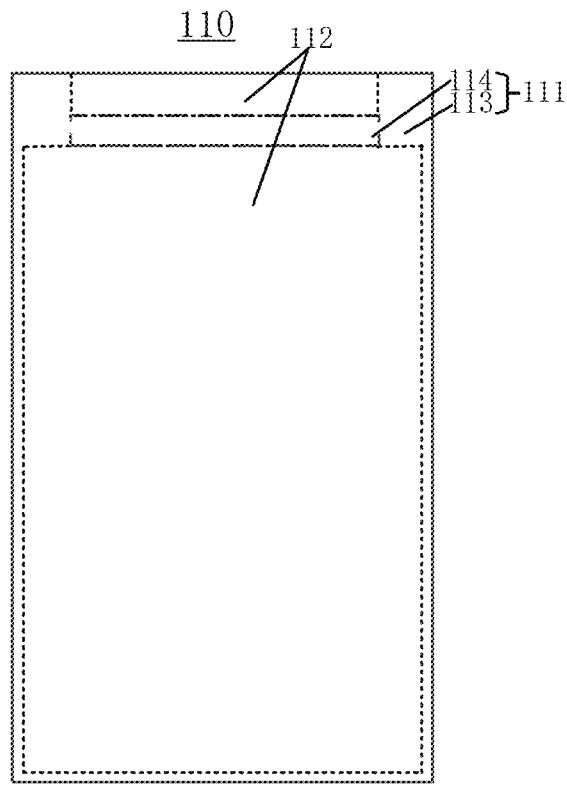

FIGS. 3A and 3B show schematic planar diagrams of the flexible substrate 120 and the back film 110 in the panel unit 100 respectively. For example, the flexible substrate 120 and the back film 110 have a same pattern in the initial panel unit 100. Referring to FIGS. 3A and 3B, the flexible substrate 120 includes a first substrate portion 121 corresponding to the non-panel area 102 of the panel unit 100 and a second substrate portion 122 corresponding to the panel area 101. That is, the first and second substrate portions 121, 122 are configured as portions of the flexible substrate 120 located at the non-panel area 102 and the panel area 101 respectively. The back film 110 includes a first back film portion 111 and a second back film portion 112. The first back film portion 111 includes a first sub-portion 113 corresponding to the non-panel area 102 and a second sub-portion 114 corresponding to the bending area BA. That is, the first and second sub-portions 113, 114 are respectively configured as portions of the back film 110 located at the non-panel area 102 and the bending area BA, and the second sub-portion 114 is configured as the peelable portion of the back film 110 located in the bending area BA. The second back film portion 112 corresponds to an area of the panel area 101 other than the bending area BA. That is, the second back film portion 112 is configured as a portion of the back film 110 located in the panel area 101 other than the bending area BA, and includes two portions spaced apart by the bending area BA. For example, the first sub-portion 113 of the first back film portion 111 has a same pattern as the first substrate portion 121, and coincides with the first substrate portion 121 in a direction perpendicular to a substrate surface of the flexible substrate 120.

When the panel unit 100 is processed to obtain the flexible panel 200, the non-panel area of the panel unit, i.e., the first substrate portion 121 and the first sub-portion 113 of the first back film portion 111, is required to be removed.

In the manufacturing method of a flexible panel according to the embodiment of the present disclosure, the peelable portion of the back film 110 located in the bending area BA, i.e., the second sub-portion 114, is peeled off while the non-panel area of the panel unit is removed.

In the embodiment of the present disclosure, the manufacturing method of a flexible panel mainly includes two steps:

1, cutting the panel unit to divide the flexible substrate 120 of the flexible panel into the first substrate portion 121 and the second substrate portion 122, and to divide the back film 110 into the first back film portion 111 and the second back film portion 112; and 2, then removing the non-panel area 102 of the panel unit while peeling off the second sub-portion 114 of the back film.

As shown in FIG. 3B, because the second sub-portion 114 of the back film 110 and the first sub-portion 113 of the back film 110 located at the non-panel area 102 are connected with each other into a whole, while the non-panel area 102 of the panel unit is removed, the second sub-portion 114 may be taken away by pulling the first sub-portion 113 of the back film 110. For example, with the above-mentioned cutting process, the second sub-portion 114 of the back film 110 may be separated from the rest of the back film 110 located in the panel area 101, and kept connected with the portion of the back film located in the non-panel area 102. Thus, the second sub-portion 114 is taken away while the non-panel area of the back film is removed, thereby patterning the back film while cutting the panel unit. The process may not only overcome the difficulty in accurately peeling the second sub-portion due to its narrow and small shape, but also dispense with an extra processing step of peeling the back film and save a process cost.

An implementation method for the two steps will be explained below exemplarily in different embodiments respectively.

Figure 4:
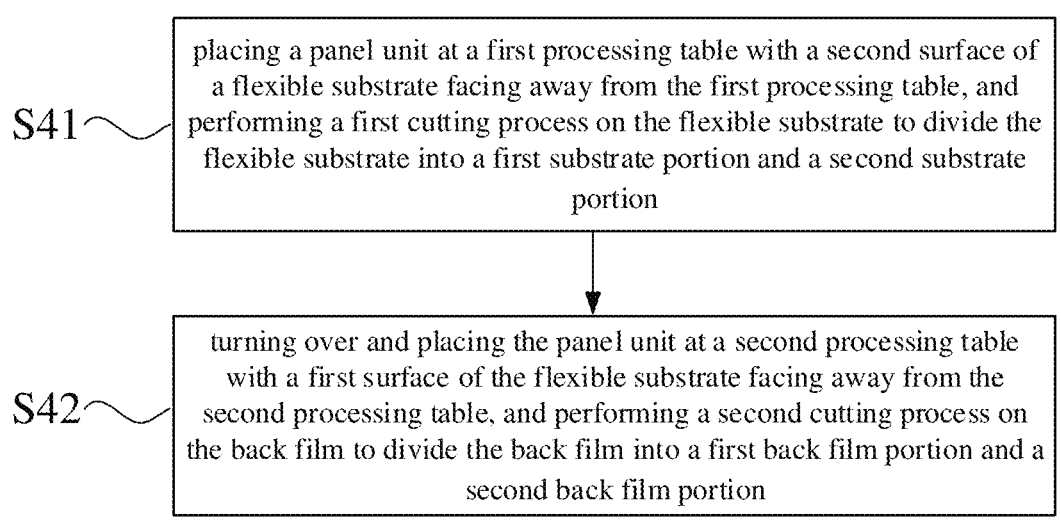
FIG. 4 is a flow chart of a cutting method of a flexible panel provided by an embodiment of the present disclosure.
Figure 5A:
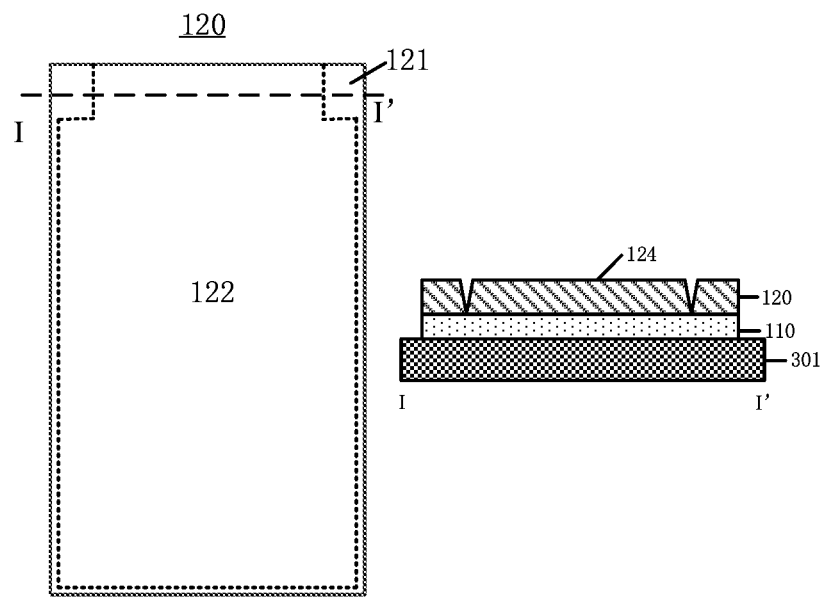
FIGS. 5A to 5B show cutting paths of the cutting method of a flexible panel provided by an embodiment of the present disclosure.
Figure 5B:
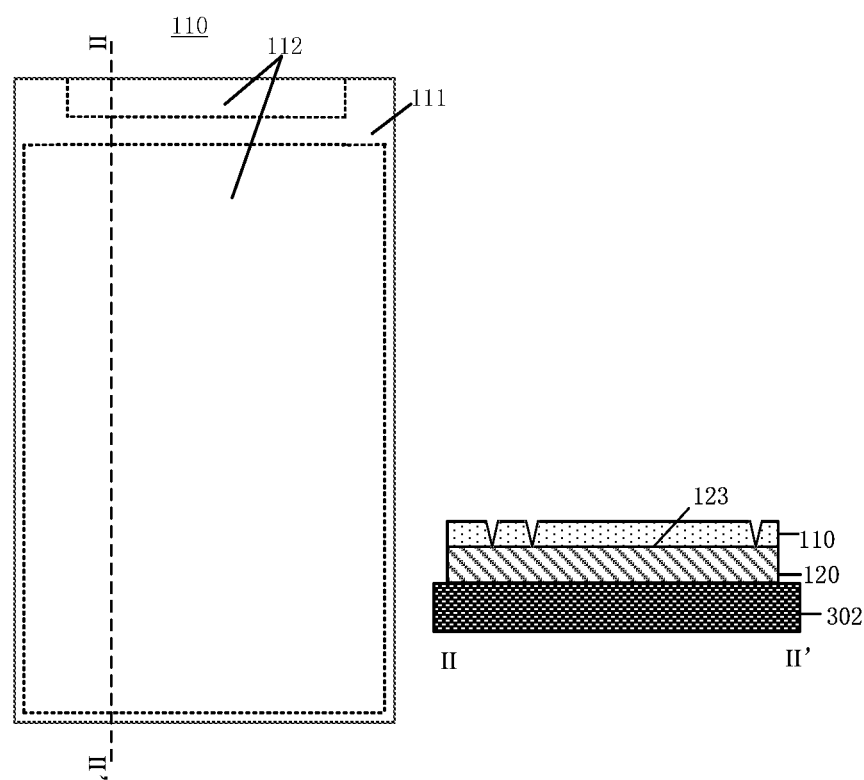

FIG. 4 shows a flow chart of a cutting method of a flexible panel according to one embodiment of the present disclosure, and FIGS. 5A to 5B show cutting paths of cutting the panel unit in the cutting method. As shown in FIG. 4, the manufacturing method at least includes the following steps S41 and S42.

Step S41: placing the panel unit 100 at a first processing table 301 with the second surface 124 of the flexible substrate 120 facing away from the first processing table, and performing a first cutting process on the flexible substrate 120 to divide the flexible substrate 120 into the first and second substrate portions 121, 122.

FIG. 5A shows the cutting path (as shown by a dotted line) and a cutting depth (as shown by a notch) of the panel unit 100 in this step, and the cutting depth only runs through the flexible substrate 120; that is, the cutting stops at a surface of the back film 110. In this step, the second surface 124 of the flexible substrate 120 faces away from a table top (supporting surface) of the first processing table 301, and as shown, if the second surface 124 (the display side surface) of the flexible substrate 120 serves as the front, at this point, the flexible substrate 120 is placed forwards relative to the first processing table 301.

Step S42: turning over the panel unit to place the flexible substrate 120 at a second processing table 302 with the first surface 123 of the flexible substrate 120 facing away from the second processing table 302, and performing a second cutting process on the back film 110 to divide the back film 110 into the first and second back film portions 111, 112.

FIG. 5B shows the cutting path (as shown by a dotted line) and a cutting depth (as shown by a notch) of the panel unit 100 in this step, and the cutting depth only runs through the back film 110; that is, the cutting stops at a surface of the flexible substrate 120. In this step, the first surface 123 of the flexible substrate 120 faces away from a table top (supporting surface) of the second processing table 302, and thus, the flexible substrate 120 is placed backwards relative to the second processing table 302.

The cutting path of the first cutting process performed when the flexible substrate 120 is placed forwards is overlapped partially with the cutting path of the second cutting process performed when the flexible substrate 120 is placed backwards, and at overlapped portions of the cutting paths, incisions of the two cutting processes are communicated with each other, such that the panel unit is cut through at the overlapped portions to be divided.

In the cutting method of a flexible panel according to the embodiment, the flexible substrate 120 and the back film 110 are cut in the two cutting steps respectively, such that the flexible substrate 120 is divided into the first and second substrate portions 121, 122, and the back film 110 is divided into the first and second back film portions 111, 112.

Figure 7B:
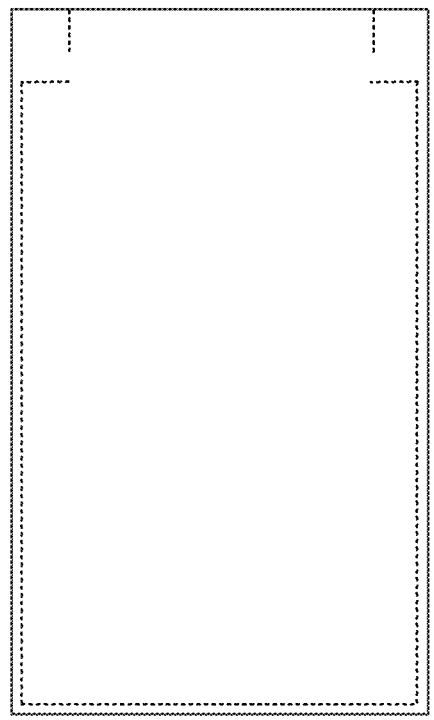
Figure 7C:
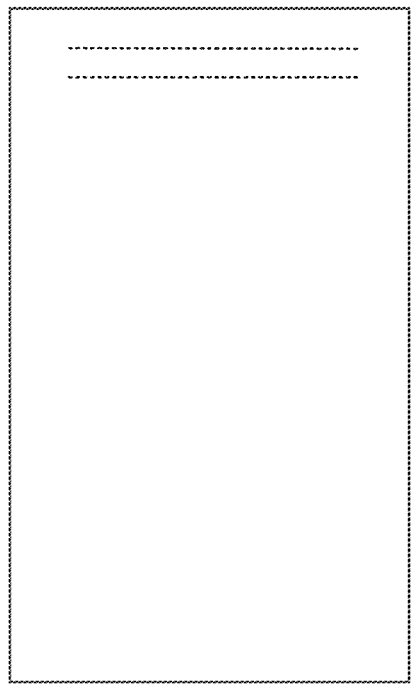

FIG. 6 shows a flow chart of a cutting method of a flexible panel according to another embodiment of the present disclosure, and FIGS. 7A to 7C show cutting paths of cutting the panel unit in cutting steps. As shown, the manufacturing method at least includes the following steps S61 and S62.

Step S61: placing the panel unit 100 at the first processing table with the second surface 124 of the flexible substrate 120 facing away from the first processing table, performing the first cutting process on the flexible substrate 120 to divide the flexible substrate 120 into the first and second substrate portions 121, 122, and meanwhile cutting the back film 110 along the cutting path of the first cutting process, except for a periphery of the second sub-portion 114.

Both the flexible substrate 120 and the back film 110 are cut in this step. At this point, the flexible substrate 120 is placed forwards relative to the first processing table. FIGS. 7A and 7B show the cutting paths (as shown by dotted lines) of the flexible substrate 120 and the back film 110 in this step respectively. It may be seen that in the step, the cutting processes of the flexible substrate 120 and the back film 110 have the cutting paths which coincide partially, and at the coincident portions of the cutting paths, the cutting depth of the panel unit 100 runs through the flexible substrate 120 and the back film 110; that is, the panel unit is cut through. However, at the portions other than the coincident portions of the cutting paths, the cutting depth of the panel unit only runs through the flexible substrate 120. That is, the panel unit is cut partially.

Step S62: turning over the panel unit 100 to place the flexible substrate 120 at the second processing table with the first surface 123 of the flexible substrate 120 facing away from the second processing table, and performing the second cutting process on the back film 110 along the periphery of the second sub-portion 114, so as to divide the back film 110 into the first and second back film portions 111, 112.

In this step, the flexible substrate 120 is placed backwards relative to the second processing table. FIG. 7C shows the cutting path of the back film 110 in this step, and as shown by a dotted line in FIG. 7C, the cutting path is configured as two connected sides of the second sub-portion 114 and the second back film portion 112, and only runs through the back film 110. The cutting path shown in FIG. 5B is formed by connecting the cutting path in the second cutting process and the cutting path of the back film 110 in the first cutting process shown in FIG. 7B. Therefore, the back film 110 may be divided into the first and second back film portions 111, 112 after the cutting steps S61, S62.

The cutting method of a flexible panel according to the embodiment involves cutting along the coincident portions of the cutting paths of the flexible substrate 120 and the back film 110 in one cutting step (for example, the step for cutting the flexible substrate), which requires to adjust the cutting depth to run through the flexible substrate 120 and the back film 110 at the coincident portions of the cutting paths. Certainly, cutting along the coincident portions of the cutting paths may also be implemented in the step for cutting the back film 110, which is not limited in the embodiment of the present disclosure.

The specific cutting method is not limited to the embodiment of the present disclosure. For example, the above-mentioned cutting process may be implemented by laser and a cutting wheel, and various suitable laser cutting devices and cutting wheel cutting devices may be adopted. In the laser cutting device, a laser beam with a high power density is output by a laser generator to irradiate a material to be cut which is heated to a vaporization temperature rapidly and vaporized to form a hole, and the cutting process of the material to be cut is completed with a movement of the laser beam; the cutting wheel cutting device includes the cutting wheel which is configured as a disc part with a cutting edge along a periphery thereof, and may be driven to rotate at a high speed in the cutting process, and for example, the cutting edge is made of diamond. For example, in the laser cutting process, cutting paths with different depths are realized by adjusting the energy of the laser beam output by the laser device; in the cutting wheel cutting process, cutting paths with different depths are realized by adjusting a height of the cutting wheel.

Figure 8:
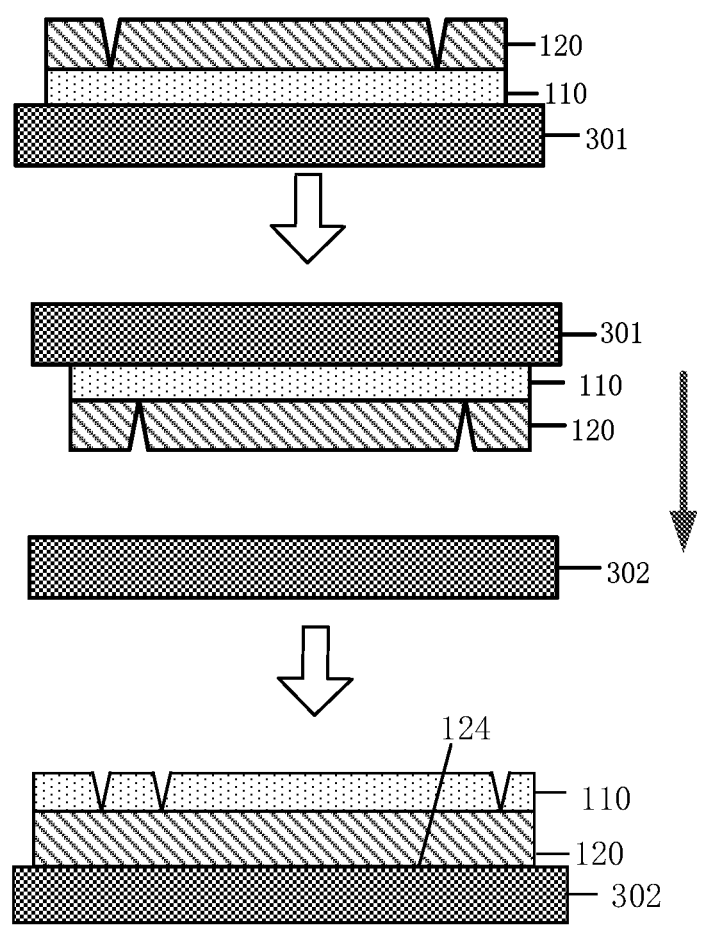
FIG. 8 shows a moving track of a panel unit in the cutting method provided by an embodiment of the present disclosure.

For example, FIG. 8 shows a moving track of the panel unit in the cutting method. As shown, the panel unit is fixed at the first and second processing tables 301, 302 by means of vacuum absorption. The first processing table 301 has an overturning function. After the first cutting process is completed, the first processing table 301 is turned over, and the panel unit is placed at the second processing table 302, and then absorbed thereto through the second surface 124 of the flexible substrate 120 by means of absorption of the panel unit by the first processing table 301.

Figure 9A:
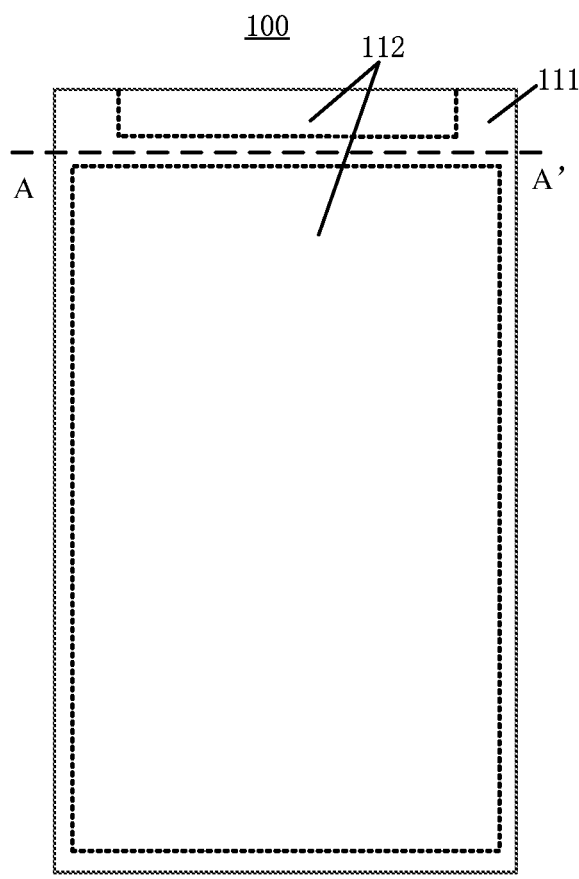
FIGS. 9A to 9B show sectional views of the panel unit according to the embodiment of the present disclosure.
Figure 9B:
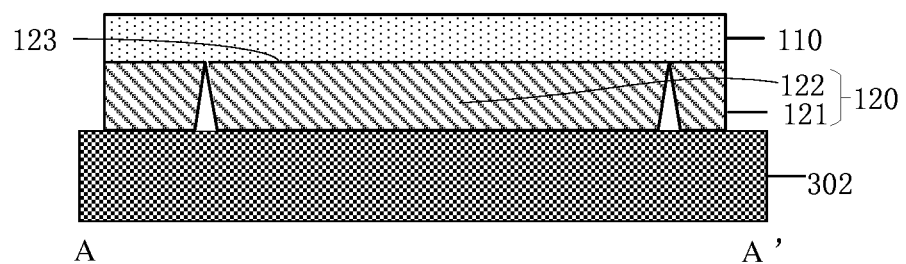

FIGS. 9A and 9B show a top view and a sectional view in a direction A-A' of the cut panel unit respectively. As shown, the panel unit 100 is placed at the second processing table 302 with the first surface 123 of the flexible substrate 120 facing away from the second processing table 302, and the flexible substrate is placed backwards. Subjected to the above-mentioned cutting process, the flexible substrate 120 is divided into the first and second substrate portions 121, 122, and the back film 110 into the first and second back film portions 111, 112. Next, the non-panel area of the flexible panel is required to be removed together with peeling off the second sub-portion 114 of the back film, thereby peeling off the peelable portion of the back film located in the bending area BA.

For example, the first substrate portion 121 is separated from the second processing table 302, the non-panel area of the panel unit 100 is removed with the first substrate portion 121 as a point of action, and the second sub-portion 114 of the back film 110 is peeled off from the flexible substrate.

For example, the first substrate portion 121 is picked up and separated from the second processing table 302.

Figure 10A:
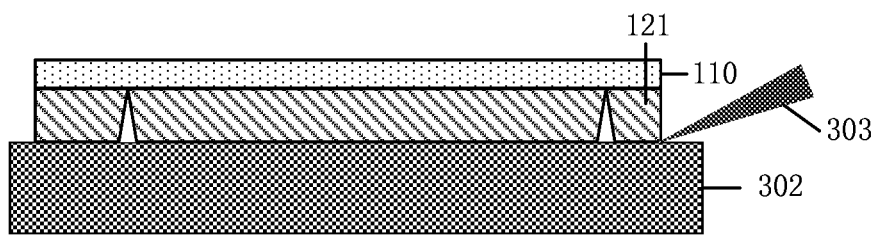
FIGS. 10A to 10B show a method of picking up a first substrate portion provided by an embodiment of the present disclosure.
Figure 10B:
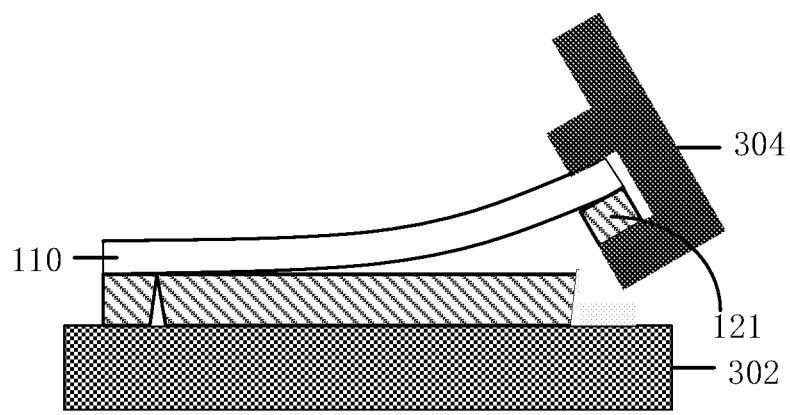

A method of picking up the first substrate portion is not limited in the embodiment of the present disclosure. FIGS. 10A to 10B show an exemplary method of picking up the first substrate portion. As shown in FIG. 10A, a blade 303 is inserted between the first substrate portion 121 and the second processing table 302 and lifts the first substrate portion 121. For example, the panel unit 100 is fixed at the second processing table 302 by means of vacuum absorption, and a very thin blade 303 is inserted between the first substrate portion 121 and the second processing table 302 from an edge to break the vacuum absorption therebetween, thereby lifting the first substrate portion easily; usually, no vacuum absorption or a little vacuum absorption force exists at the edge.

Then, as shown in FIG. 10B, one end of the first substrate portion is clamped by a clamp 304 to drive the first substrate portion to peel off the second sub-portion 114 of the back film 110. In another example, the clamp 304 may be replaced with a vacuum absorption pickup head acting on a surface of the first back film portion 111 corresponding to the end of the first substrate portion 121, and an applied absorption force of the vacuum absorption pickup head is greater than an absorption force applied by the second processing table 302 to the first substrate portion, thereby picking up the first substrate portion 121.

Figure 11A:
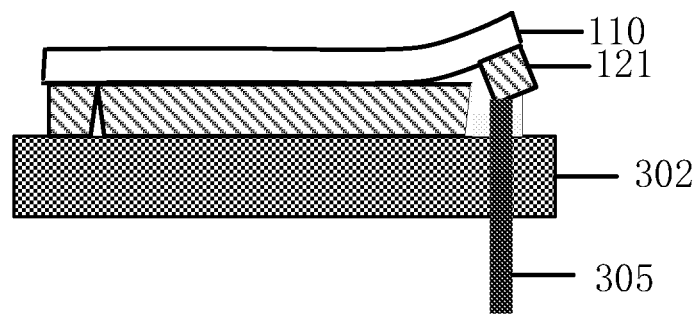
FIGS. 11A to 11B show a method of picking up a first substrate portion provided by another embodiment of the present disclosure.

FIG. 11A shows another exemplary method of picking up the first substrate portion. As shown, a supporting rod 305 is provided in the second processing table 302 corresponding to the non-panel area 102 of the panel unit 100. That is, the supporting rod 305 corresponds to the first substrate portion 121. The supporting rod 305 may be movable relative to the second processing table 302 in a direction perpendicular to the table top of the second processing table 302; for example, the supporting rod 305 may be driven spirally, pneumatically, hydraulically, or the like. During picking up the first substrate portion, the supporting rod 305 is moved to protrude from the second processing table 302, so as to lift the first substrate portion 121. The supporting rod may be provided in the processing table and driven by a drive mechanism provided in the processing table; or, the supporting rod may be provided through a through hole running through the processing table, and driven by a drive mechanism provided outside the processing table.

Figure 11B:
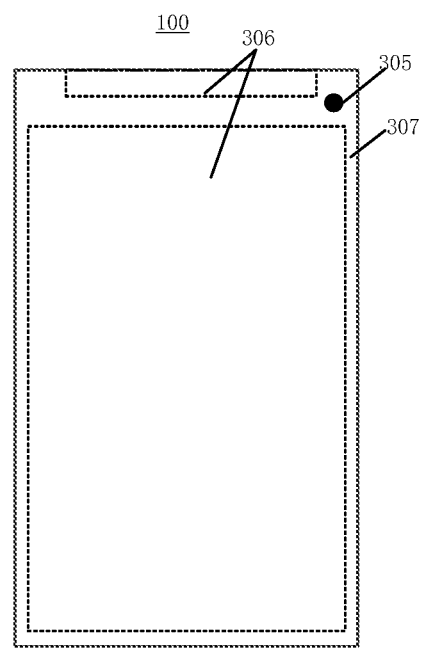

For example, the second processing table 302 may be provided with independent vacuum absorption air paths respectively, corresponding to the panel area 101 and the non-panel area 102 of the panel unit 100. As shown in FIG. 11B, the second processing table 302 may be provided therein with a first vacuum air path 306 and a second vacuum air path 307 respectively, corresponding to the panel area 101 and the non-panel area 102 of the panel unit 100. In the cutting process, both the first and second vacuum air paths 306, 307 are open, and thus, the whole panel unit 100 is absorbed to the second processing table 302, thereby guaranteeing smoothness of the panel unit 100 to facilitate the cutting process. During separation, the first vacuum air path 306 is kept open, and the second vacuum air path 307 is closed, thereby facilitating separation of the non-panel area 102 of the panel unit 100 from the second processing table.

The embodiment of the present disclosure further provides a manufacturing device of a flexible panel configured to implement the above-mentioned manufacturing method of a flexible panel. The manufacturing device includes a back film removing unit configured to remove the non-panel area 102 of the panel unit 100 while peeling off the peelable portion of the back film 110 located in the bending area BA of the flexible panel 200, i.e., the second sub-portion 114 of the back film 110.

Figure 12:
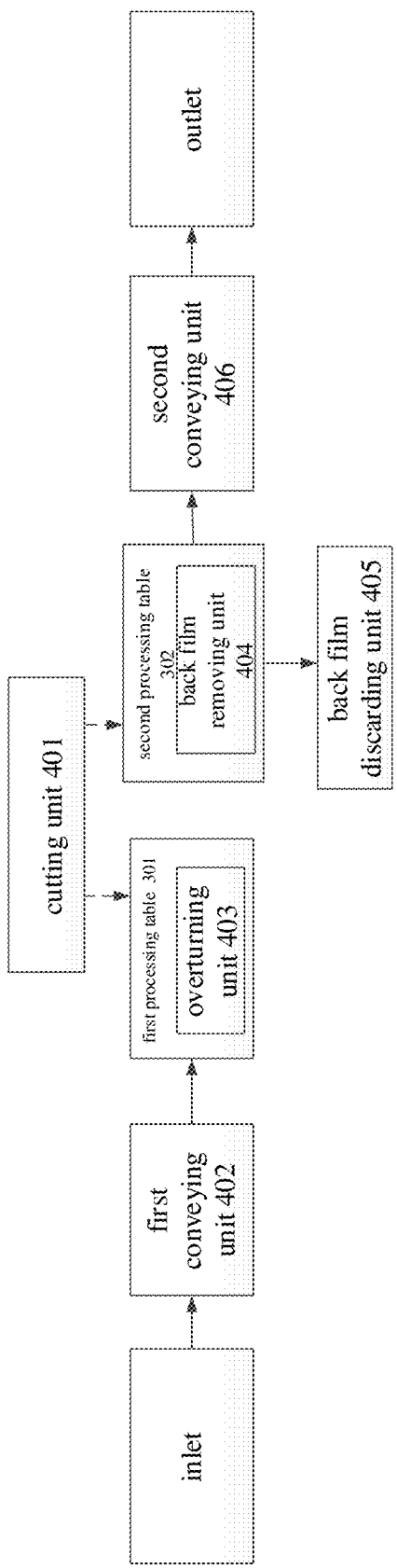
FIG. 12 shows a functional block diagram of a manufacturing device of a flexible panel provided by an embodiment of the present disclosure.

FIG. 12 shows a functional block diagram of the manufacturing device of a flexible panel according to the embodiment. For example, in addition to the back film removing unit 404, the manufacturing device 400 includes a cutting unit 401, a first conveying unit 402, a first processing table 301, a second processing table 302, a back film discarding unit 405 and a second conveying unit 406, and integrates a plurality of functions, such as a conveying function, a cutting function, an overturning function, a back film removing function, or the like. For example, the back film removing unit 404 is integrated into the second processing table 302.

For example, the first and second conveying units 402, 406 may have various suitable forms, for example, a conveyor belt, a mechanical arm, or the like. The cutting unit 401 may have a suitable form, includes a cutting portion configured as a laser cutting portion or a cutting wheel cutting portion, and as required, may further include a drive mechanism configured to move the cutting portion along a set path, or the like. In addition to a table top and an absorption device, the first processing table 301 may integrate the overturning unit 403 with the overturning function, configured to turn over the panel unit to be cut, and for example, the overturning unit 403 includes a mechanical arm by which the table top may be turned over by 180 degrees. The second processing table 302 includes a table top and an absorption device, and integrates the back film removing unit 404 with the back film removing function. The back film removing unit is configured to remove the non-panel area of the panel unit, and includes the above-mentioned blade or supporting rod, and the clamp or vacuum absorption head, or the like. The back film discarding unit 404 may include a container to store the removed non-panel area of the panel unit.

For example, a working process of the manufacturing device 400 may include: loading the panel unit to be cut from a panel unit loading inlet, and conveying the panel unit to the first processing table 301 by the first conveying unit 402; absorbing and fixing the panel unit by the first processing table 301, and then performing the first cutting process on the panel unit using the cutting unit 401; then turning over the panel unit using the overturning unit 403, placing the panel unit at the second processing table 302, absorbing and fixing the panel unit by the second processing table 302, and performing the second cutting process on the panel unit, for example, using the laser cutting portion or the cutting wheel cutting portion; next, removing the non-panel area of the panel unit using the back film removing unit 404 while peeling off the peelable portion (for example, the second sub-portion in the above-mentioned embodiments) of the back film located in the bending area, and conveying the removed portion into the back film discarding unit 405 for recycle; and finally, conveying the panel unit into a panel unit outlet using the second conveying unit 406.

For example, the manufacturing device 400 further includes a control device (not shown) which may include a processor and a memory, for example. For example, the processor may be configured as a central processing unit (CPU) or other types of processing units having a data processing and/or instruction execution capacity, and for example, the processor may be implemented as a general purpose processor, a single chip microcomputer, a microprocessor, a digital signal processor, a dedicated image processing chip, a field programmable logic array, or the like. For example, the memory may include a volatile memory and/or a nonvolatile memory, such as a read-only memory (ROM), a hard disc, a flash memory, or the like. Correspondingly, the memory may be implemented as one or more computer program product(s), and the computer program product may include various forms of computer readable storage media having one or more computer program instruction(s) stored thereon. The program instruction may be run by the processor to realize functions of the control device or other desired functions in the embodiment of the present invention. For example, the control device may control the first and second conveying units 402, 406 to move, the cutting unit 401 to, for example, perform the above-mentioned first and second cutting processes, the first processing table 301 to be turned over, the back film removing unit 404 to move, or the like.

The foregoing merely are exemplary embodiments of the disclosure, and not intended to define the scope of the disclosure, and the scope of the disclosure is determined by the appended claims.

What is claimed is:

1. A manufacturing method of a flexible panel, the flexible panel comprising a bending area, the manufacturing method comprising:
   providing a panel unit, wherein the panel unit comprises a flexible substrate and a back film which are laminated, and the panel unit comprises a panel area comprising the flexible panel and a non-panel area outside the panel area; and
   removing the non-panel area from the panel area of the panel unit while peeling off a peelable portion of the back film in the bending area of the flexible panel and keeping a remaining portion of the back film in the panel area.

2. The manufacturing method according to claim 1, wherein the removing the non-panel area from the panel area of the panel unit while peeling off the peelable portion of the back film in the bending area of the flexible panel and keeping the remaining portion of the back film in the panel area comprises:
   cutting the flexible substrate, to divide the flexible substrate into a first substrate portion in the non-panel area and a second substrate portion in the panel area; and
   cutting the back film, to divide the back film into a first back film portion and a second back film portion, the first back film portion comprising a first sub-portion and a second sub-portion which are connected with each other, wherein the second back film portion is configured as the remaining portion of the back film in the panel area, the first sub-portion is in the non-panel area, and the second sub-portion is configured as the peelable portion of the back film in the bending area.

3. The manufacturing method according to claim 2, wherein the flexible substrate comprises a first surface and a second surface which are opposite to each other, and the back film is on the first surface of the flexible substrate;
   the cutting the back film, to divide the back film into the first back film portion and the second back film portion, comprises:
   placing the panel unit on a first processing table with the second surface of the flexible substrate facing away from the first processing table, and
   performing a first cutting process on the flexible substrate to divide the flexible substrate into the first substrate portion and the second substrate portion.

4. The manufacturing method according to claim 3, wherein the cutting the back film into the first back film portion and the second back film portion comprises:
   turning over and placing the panel unit on a second processing table with the first surface of the flexible substrate facing away from the second processing table, and
   performing a second cutting process on the back film to divide the back film into the first back film portion and second back film portion.

5. The manufacturing method according to claim 4, wherein the removing the non-panel area of the panel unit while peeling off the peelable portion of the back film in the bending area of the flexible panel further comprises:
   removing the non-panel area of the panel unit with the first surface of the flexible substrate facing away from the second processing table, after the cutting the back film into the first back film portion and second back film portion.

6. The manufacturing method according to claim 5, wherein the removing the non-panel area of the panel unit comprises:
   separating the first substrate portion from the second processing table, and
   peeling off the second sub-portion of the back film from the flexible substrate with the first substrate portion as a point of action.

7. The manufacturing method according to claim 6, wherein the separating the first substrate portion from the second processing table comprises:
   picking up the first substrate portion from the second processing table to separate the first substrate portion from the second processing table.

8. The manufacturing method according to claim 7, wherein the picking up the first substrate portion from the second processing table comprises:
inserting a blade between the first substrate portion and the second processing table, and lifting the first substrate portion.

9. The manufacturing method according to claim 8, wherein the separating the first substrate portion from the second processing table further comprises:
clamping the first substrate portion by a clamp and driving the first substrate portion to peel off the second sub-portion of the back film.

10. The manufacturing method according to claim 7, wherein the picking up the first substrate portion from the second processing table comprises:
enabling a supporting rod provided in the second processing table to protrude from the second processing table, so as to lift the first substrate portion.

11. The manufacturing method according to claim 10, wherein the separating the first substrate portion from the second processing table further comprises:
clamping the first substrate portion by a clamp and driving the first substrate portion to peel off the second sub-portion of the back film.

12. The manufacturing method according to claim 7, wherein the separating the first substrate portion from the second processing table further comprises:
clamping the first substrate portion by a clamp and driving the first substrate portion to peel off the second sub-portion of the back film.

13. The manufacturing method according to claim 3, wherein the cutting the back film into the first back film portion and second back film portion comprises:
cutting the back film along a cutting path of the first cutting process except for a periphery of the second sub-portion while performing the first cutting process on the flexible substrate.

14. The manufacturing method according to claim 13, wherein the cutting the back film into the first back film portion and the second back film portion further comprises:
turning over and placing the panel unit at the second processing table with the first surface of the flexible substrate facing away from the second processing table, and
performing the second cutting process on the back film along the periphery of the second sub-portion to divide the back film into the first back film portion and the second back film portion.

15. The manufacturing method according to claim 14, wherein the removing the non-panel area of the panel unit while peeling off the peelable portion of the back film in the bending area of the flexible panel further comprises:
after the cutting the back film into the first back film portion and second back film portion, removing the non-panel area of the panel unit with the first surface of the flexible substrate facing away from the second processing table.

16. The manufacturing method according to claim 3, wherein
the panel unit is fixed to the first processing table through vacuum absorption.

17. The manufacturing method according to claim 1, wherein the removing the non-panel area from the panel area of the panel unit comprises cutting by a cutting wheel or a cutting laser.

* * * * *